(12) United States Patent
Yu et al.

(10) Patent No.: US 7,504,329 B2
(45) Date of Patent: Mar. 17, 2009

(54) METHOD OF FORMING A YB-DOPED NI FULL SILICIDATION LOW WORK FUNCTION GATE ELECTRODE FOR N-MOSFET

(75) Inventors: HongYu Yu, Heverlee (BE); Chen JingDe, Singapore (SG); Li Mingfu, Singapore (SG); Dim-Lee Kwong, Singapore (SG); Serge Biesemans, Leuven (BE); Jorge Adrian Kittl, Waterloo (BE)

(73) Assignees: Interuniversitair Microelektronica Centrum (IMEC), Leuven (BE); National University of Singapore (NUS), Singapore (SG); Texas Instruments Incorporated, Dallas, TX (US)

( * ) Notice: Subject to any disclaimer, the term of this patent is extended or adjusted under 35 U.S.C. 154(b) by 232 days.

(21) Appl. No.: 11/382,875

(22) Filed: May 11, 2006

(65) Prior Publication Data

US 2006/0286802 A1    Dec. 21, 2006

Related U.S. Application Data

(60) Provisional application No. 60/680,276, filed on May 11, 2005.

(30) Foreign Application Priority Data

Dec. 9, 2005    (EP) ................... 05447278
Jan. 6, 2006    (EP) ................... 06447002

(51) Int. Cl.
    *H01L 21/477* (2006.01)
(52) U.S. Cl. ............ 438/592; 438/664; 438/682; 438/649; 257/E21.165

(58) Field of Classification Search .......... 438/649, 438/592, 664, 682
See application file for complete search history.

(56) References Cited

U.S. PATENT DOCUMENTS

| 4,528,744 | A  | * | 7/1985 | Shibata ................. 438/301 |
| 4,738,937 | A  |   | 4/1988 | Parsons |
| 5,614,728 | A  | * | 3/1997 | Akiyama ................. 257/57 |
| 6,815,839 | B2 | * | 11/2004 | Nii et al. ................. 257/379 |
| 2003/0139002 | A1 |   | 7/2003 | Snyder |
| 2003/0160227 | A1 |   | 8/2003 | Mistra et al. |
| 2005/0059242 | A1 |   | 3/2005 | Cabral et al. |
| 2005/0093033 | A1 |   | 5/2005 | Kinoshita et al. |
| 2005/0272235 | A1 | * | 12/2005 | Wu et al. ................. 438/592 |
| 2005/0275033 | A1 | * | 12/2005 | Zhu et al. ................. 257/368 |

OTHER PUBLICATIONS

Liu et al. "Dual-Work-Function Metal Glass by Full Silicidation of Poly-Si With Co-Ni Bi-layers", IEEE Electron Device Letters 2005.

(Continued)

*Primary Examiner*—Marcos D. Pizarro
*Assistant Examiner*—Eva Y. Montalvo
(74) *Attorney, Agent, or Firm*—Knobbe Martens Olson & Bear LLP

(57) ABSTRACT

Low work function metals for use as gate electrode in nMOS devices are provided. The low work function metals include alloys of lanthanide(s), metal and semiconductor. In particular, an alloy of nickel-ytterbium (NiYb) is used to fully silicide (FUSI) a silicon gate. The resulting nickel-ytterbium-silicon gate electrode has a work function of about 4.22 eV.

28 Claims, 12 Drawing Sheets

OTHER PUBLICATIONS

Yu et al. "Low Work function Fully Silicided Gate on $SiO_2$/Si and La $AlO_3$/GOI n-MOSFETS", Proceedings of *62nd Device Research Conference* (*DRC*), pp. 21, Notre Dame, Indiana, Jun. 2004.

Chen et al., Yb-Doped Ni FUSI for the n-MOSFETs Gate Electrode Application, IEEE Electrode Device Letters, vol. 27, No. 3, Mar. 2006, pp. 160-162.

* cited by examiner

METHOD OF FORMING A YB-DOPED NI FULL SILICIDATION LOW WORK FUNCTION GATE ELECTRODE FOR N-MOSFET

CROSS-REFERENCE TO RELATED APPLICATIONS

This application claims the benefit under 35 U.S.C. § 119 (e) of U.S. provisional application Ser. No. 60/680,276, filed May 11, 2005, the disclosure of which is hereby incorporated by reference in its entirety and is hereby made a portion of this application.

FIELD OF THE INVENTION

The present invention relates to the field of semiconductor devices, in particular to field effect devices comprising a metal gate electrode, more particularly a metal gate electrode formed by silicidation of a semiconductor material and to methods for fabricating such field effect devices.

BACKGROUND OF THE INVENTION

In order to improve the performance of MOSFET devices the well known polysilicon is being replaced as gate electrode material by metals. Such metal gates do not suffer from the shortcomings of a semiconducting gate electrode such as gate depletion, dopant diffusion or medium range resistance. However, obtaining the desired work function for both nMOS and pMOS devices in view of controlling the threshold voltage is not as straightforward as in the case of polysilicon gates, as the work function of polysilicon can be tuned by doping the polysilicon with a well-defined amount of an appropriate dopant, e.g., boron for pMOS devices, thereby forming a high work function gate electrode, and phosphorus for nMOS devices, thereby forming a low work function gate electrode.

Initially, midgap metals were introduced to form metal gates. Midgap metals are materials having a Fermi level near the midgap position between the valence and conduction band of the semiconducting substrate on which the MOSFET is formed. An example of such midgap metal is $CoSi_2$ having a work function of about 4.65 eV. This metal gate material is formed by a full silicidation (FUSI) of a polysilicon gate electrode whereby essentially all the polysilicon is converted into a silicide during reaction with Co. Although symmetric threshold voltages for nMOS and pMOS devices can be obtained using such a midgap metal, these threshold voltages are too high compared with the supply voltage at which these NMOS and pMOS are to operate.

In order to obtain the desired, low, threshold voltage for nMOS and pMOS devices a dual metal gate approach is currently being pursued. Here, the material of the gate electrode of the NMOS device is a metal having a low work function, ideally about 4 to 4.2 eV, while the material of the pMOS gate electrode is another metal having a high work function, ideally about 5 to 5.2 ev. Finding an appropriate low-work function metal for use as NMOS gate electrode is of particular importance, as such metal reacts rapidly with the oxygen present in the underlying dielectric, e.g., silicon-oxide or high-k dielectrics.

Tuning of the work function of a gate electrode metal by alloying it with other metals, in order to match the work function requirements for an nMOS or pMOS gate electrode, is known.

V. Mistra et al. discloses in United States Publication No. US-2003/0160227-A1 the alloying of a first metal having a higher work function with a second metal B having a lower work function. Depending on the ratio, the resulting alloy $A_xB_{1-x}$ will have a work function ranging from the work function of the first metal A to the work function of the second metal B. The lowest work function obtainable is determined by the work function of the second metal B, which is selected from the group of Mn, Mg, V, Ti, Cr, Y, Zr, Ta, La, Gd, Sm, Pr, Nb, Al, Hf and alloys thereof. Mistra et al. does not teach the formation of a fully silicided gate electrode using such binary alloys.

J. Liu et al. discloses in "Dual-Work-Function Metal Gates by Full Silicidation of Poly-Si With Co—Ni Bi-layers", IEEE Electron Device Letters 2005, the formation of dual work function metal gates fabricated by full silicidation (FUSI) of a Co—Ni bi-layer and a comparison of these alloyed metal gates with single-metal FUSI systems of $CoSi_2$ and NiSi. The alloy of $Co_xNi_{1-x}Si$ allows combining the low work function of NiSi with the thermal stability of CoSi.

Yu et al. discloses in "Low Work function Fully Silicided Gate on $SiO_2$/Si and La $AlO_3$/GOI n-MOSFETS", Proceedings of 62*nd Device Research Conference (DRC)*, pp. 21, Notre Dame, Ind., June, 2004, the combination of the low resistive NiSi, having a high work function of about 4.9 eV, with Hf or TiSi to obtain a low work function of 4.2 eV and 4.3 eV respectively.

SUMMARY OF THE INVENTION

The preferred embodiments aim at providing a new low work function material, which is stable, reproducible, and methods for producing said new low work function material, which are reproducible and easy to implement.

In one aspect, the preferred embodiments relate to a method for modulating the work function of a silicided gate electrode.

The preferred embodiments relate to the use of at least one lanthanide, preferably the use of Yb, for reducing the work function of a fully or partially silicided gate electrode.

A method of the preferred embodiments comprises the steps of:
 implanting lanthanide(s) ions into a surface of a semiconductor layer,
 depositing a suitable metal layer upon said semiconductor, and
 siliciding said semiconductor layer and said metal layer.

Preferably, said semiconductor layer comprises Si, Ge or SiGe.

In a method according to the preferred embodiments, said step of implanting lanthanide(s) ions can be performed after the silicidation step.

Alternatively, said step of implanting lanthanide(s) ions can be performed between the step of depositing said metal and the silicidation step.

Preferably, said semiconductor layer is formed upon a high-k (k>3.9) dielectric layer.

In a method of the preferred embodiments, two, three or more lanthanides can be used. Preferably, said at least one lanthanide is Yb.

Said metal can be any metal suitable for silicidation. Preferably, Ni is used for silicidation.

In a method according to the preferred embodiments, the step of siliciding said semiconductor material can comprise the step of providing a thermal budget such as to convert substantially all said semiconductor material into silicide and optionally the step of removing any unreacted metal.

Alternatively, the step of siliciding said semiconductor material can comprise the step of providing a first thermal budget to convert partially said semiconductor material into silicide, the step of removing any unreacted metal, and the step of providing a second thermal budget for completion of the conversion of said semiconductor material into silicide.

Another aspect of the preferred embodiments relates to a metallic alloy comprising at least one lanthanide (preferably Yb), a suitable metal for silicidation (preferably Ni), and a semiconductor preferably selected from the group consisting of silicon (Si), Germanium (Ge) and silicon-germanium (SiGe).

A metallic alloy according to the preferred embodiments can be used as a low work function material (i.e., smaller than about 4.5 eV, preferably smaller than about 4.2 eV, more particularly between about 4 and about 4.2 eV).

A method for forming a low work function metallic alloy can comprise the steps of:
  providing at least one layer comprising a suitable metal for silicidation (preferably Ni), at least one lanthanide (preferably Yb) and a semiconductor preferably comprising Si, Ge or SiGe, or
  providing at least one layer stack comprising a suitable metal for silicidation (preferably Ni), at least one lanthanide (preferably Yb) and a semiconductor preferably comprising Si, Ge or SiGe, wherein each layer comprises a suitable metal for silicidation (preferably Ni), and/or at least one lanthanide (preferably Yb) and/or a semiconductor preferably comprising Si, Ge or SiGe, and
  annealing said layer(s) to form an alloy.

The preferred embodiments also relate to an nMOSFET comprising a gate electrode and a gate dielectric, wherein the gate electrode comprises at least one lanthanide, a suitable metal for silicidation, and a semiconductor preferably selected from the group consisting of silicon (Si), Germanium (Ge) and silicon-germanium (SiGe).

More particularly, in an nMOSFET according to the preferred embodiments, the gate electrode comprises an alloy of said at least one lanthanide, said suitable metal, and said semiconductor.

Preferably, said at least one lanthanide is ytterbium (Yb).

Preferably, said metal is nickel (Ni)

Preferably, said semiconductor is Si.

Preferably, in an nMOSFET according to the preferred embodiments, the gate electrode comprises an alloy of Yb, Ni and Si.

A method for forming an nMOSFET can comprise the steps of:
  depositing at least one lanthanide and a suitable metal for silicidation upon or over a semiconductor gate electrode,
  transforming said semiconductor gate electrode in a (fully or partially) silicided gate electrode.

In a method for forming a nMOSFET according to the preferred embodiments, the step of depositing said metal and said lanthanide(s) can include depositing alternatively at least one layer of metal and at least one layer of said lanthanide(s).

The last layer deposited can be said metal layer.

Said metal and said lanthanide(s) can be sequentially sputtered on said semiconductor gate electrode. Alternatively, said metal and said lanthanide(s) can be co-deposited, in particular can be simultaneously sputtered on said semiconductor gate electrode.

A method for forming an nMOSFET according to the preferred embodiments can further comprise the step of forming a capping layer over said deposited metal and lanthanide (s) before the step of transforming said semiconductor gate electrode in a silicided gate electrode.

A method for forming an nMOSFET according to the preferred embodiments can further comprise the step of selectively removing the unreacted metal and lanthanide(s) after forming the silicided gate electrode.

Preferably, in a method for forming an nMOSFET according to the preferred embodiments, said semiconductor layer is formed upon a high-k dielectric layer. Preferably, said at least one lanthanide is Yb. Preferably, the metal used for silicidation is Ni.

BRIEF DESCRIPTION OF THE DRAWINGS

All drawings are intended to illustrate some aspects and embodiments of the present invention. Devices are depicted in a simplified way for reason of clarity. Not all alternatives and options are shown and therefore the invention is not limited to the content of the given drawings. Like numerals are employed to reference like parts in the different figures.

DETAILED DESCRIPTION OF THE PREFERRED EMBODIMENT

Figure 1A:
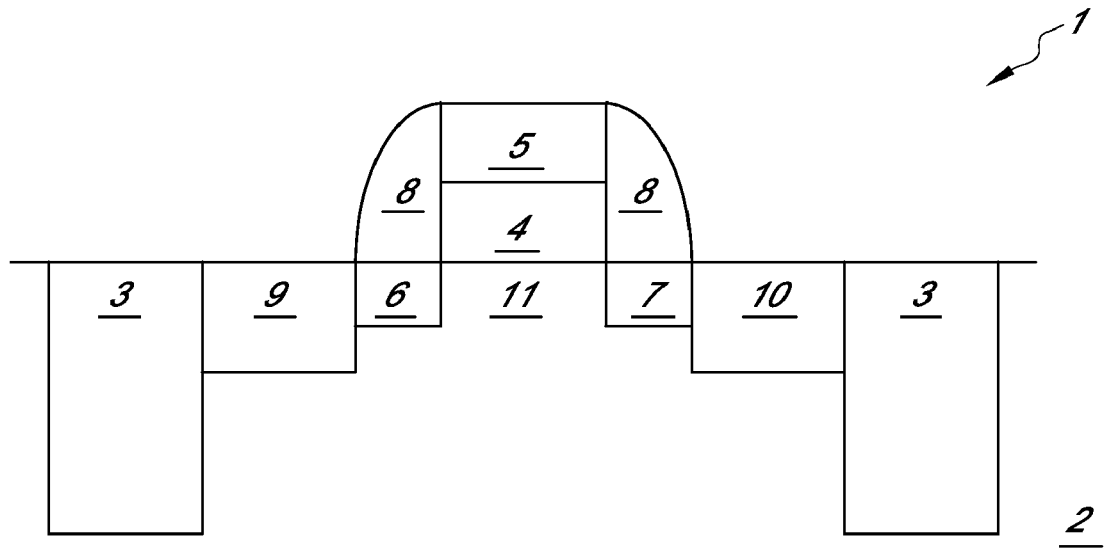
FIG. 1 shows a schematic cross-section of devices according to the preferred embodiments: (a) bulk MOSFET, (b) MuGFET.

The preferred embodiments relate to a low work function metallic alloy comprising at least one lanthanide, a suitable metal for silicidation, and a semiconductor, said semiconductor comprising Si, Ge or SiGe.

In the context of the preferred embodiments, the lanthanides include 15 elements from lanthanum to lutetium on the periodic table, including lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

In a preferred metallic alloy, said lanthanide is Yb.

In a preferred metallic alloy, said metal is Ni.

In a preferred metallic alloy, said semiconductor is Si.

More particularly, a preferred metallic alloy is Yb, Ni or Si.

The preferred embodiments also provide a method for manufacturing a metallic alloy.

The method comprises the steps of:
providing at least one lanthanide, a suitable metal for silicidation, and a semiconductor, said semiconductor comprising Si, Ge or SiGe, and
annealing said layer stack (14, 13) to form an alloy.

The preferred embodiments relate to an nMOSFET comprising a gate electrode (5) and a gate dielectric (4) characterized in that the gate electrode (5) comprises at least one lanthanide, a suitable metal for silicidation, and a semiconductor, said semiconductor comprising Si, Ge or SiGe.

The preferred embodiments also provide a method to manufacture a fully silicided nMOSFET (FUSI nMOSFET), comprising the steps of:
providing a precursor nMOSFET comprising a semiconductor gate electrode (13),
forming a layer stack (14) comprising a suitable metal and at least one lanthanide at least on said semiconductor gate electrode (13), and
transforming said semiconductor gate electrode (13) in a silicided gate electrode (5).

The method can further comprise forming a capping layer (15) over said layer stack (14) before forming the silicided gate electrode (5).

The method can further comprise selectively removing the unreacted metal after forming the silicided gate electrode (5).

The terms "silicide", "silicided", and "silicidation" as used herein are broad terms, and are to be given their ordinary and customary meaning to a person of ordinary skill in the art (and are not to be limited to special or customized meanings), and refer without limitation to the reaction between a metal and silicon, but is not intended to be limited to silicon. For instance, the reaction of a metal with Ge, or any other suitable semiconductor material, may still be referred to as silicidation.

The term "metal-rich silicide" as used herein is a broad term, and is to be given its ordinary and customary meaning to a person of ordinary skill in the art (and is not to be limited to a special or customized meaning), and refers without limitation to the material resulting from the reaction between said metal and said semiconductor, wherein the ratio metal-to-semiconductor is larger than 1.

In a first aspect, the preferred embodiments provide a nMOSFET device comprising a gate electrode and a gate dielectric characterized in that the gate electrode comprises nickel (Ni), ytterbium (Yb) and silicon (Si).

Preferably, in an nMOSFET of the preferred embodiments, the gate electrode comprises an alloy of nickel (Ni), ytterbium (Yb) and silicon (Si).

Said alloy can be represented by the formula $Ni_xYb_ySi_{1-x-y}$ where $0.3<x<0.7$, and $0.005<y<0.2$. Preferably, $x=0.55$ and $y=0.12$.

Also provided is a metallic alloy comprising nickel (Ni), ytterbium (Yb) and silicon (Si).

Said metallic alloy can be represented by the formula $Ni_xYb_ySi_{1-x-y}$ where $0.3<x<0.7$, and $0.005<y<0.2$. Preferably, $x=0.55$ and $y=0.12$.

Said metallic alloy can be used as a low work function material.

Said metallic alloy can be used as a low work function material in a nMOSFET device wherein said work function is smaller than (about) 4.5 eV, preferably said work function is comprised between (about) 3.9 eV and (about) 4.5 eV, more preferably said work function is from (about) 4 eV to (about) 4.2 eV.

The preferred embodiments also provide a method for forming an alloy, which can be used as low work function material, comprising the steps of:
providing at least one layer comprising nickel, ytterbium and silicon, or
providing at least one layer stack, said stack comprising nickel, ytterbium and silicon, and wherein each layer comprises nickel, ytterbium and/or silicon, and
annealing said layer(s) to form a nickel, ytterbium, silicon alloy.

The preferred embodiments also provide a method for forming a (partially or fully) silicided nMOSFET comprising the steps of:
depositing nickel and ytterbium on at least a semiconductor gate electrode comprising silicon,
transforming (partially or fully) (by heat treatment) said semiconductor gate electrode in a nickel-ytterbium-silicide gate electrode.

Preferably, a fully silicided nMOSFET (FUSI nMOSFET) is formed.

In a method of the preferred embodiments, the step of depositing said nickel and ytterbium can include depositing alternately at least one layer of nickel and at least one layer of ytterbium.

Said nickel and Ytterbium can be sequentially sputtered on said semiconductor gate electrode.

Preferably, the last layer deposited is a nickel layer.

Alternatively, said nickel and ytterbium can be co-deposited, in particular they can be simultaneously sputtered on said semiconductor gate electrode.

A capping layer can be deposited over said deposited nickel and ytterbium before the step of transforming said semiconductor gate electrode in a nickel-ytterbium-Silicide gate electrode.

A method of the preferred embodiments can further comprise the step of selectively removing the unreacted nickel and ytterbium after forming the nickel-ytterbium Silicide gate electrode.

In another aspect, the preferred embodiments relate to the use of at least one lanthanide for reducing the work function of a gate electrode.

The use of a lanthanide, by ion implantation, before silicidation, allows reduction of the effective work function of fully silicided gates.

Some of the lanthanide ions implanted segregate to the interface between the metal gate and the dielectric, lowering the effective work function.

More particularly, a method for modulating the work function of a silicided gate electrode is provided, comprising the steps of:
implanting lanthanide(s) ions into a surface of a semiconductor layer, said semiconductor layer comprising Si, Ge or SiGe,
depositing a suitable metal layer upon said semiconductor, and
siliciding said semiconductor layer and said metal layer.

In a method of the preferred embodiments, the step of implanting lanthanide(s) ions can be performed between the step of depositing said metal and the silicidation step.

In another alternative embodiment, the step of implanting lanthanide(s) ions can be performed after the silicidation step. Preferably an annealing step is performed after the step of implanting the lanthanide(s) ions.

Preferably, the silicidation step is such as to obtain a fully silicided gate electrode.

In a method of the preferred embodiments the step of fully siliciding said semiconductor material can comprise the step of providing a thermal budget to convert substantially all said semiconductor material into silicide and the step of removing any unreacted metal.

Alternatively, the step of fully siliciding said semiconductor material can comprise the step of providing a first thermal budget to convert partially said semiconductor material into silicide, the step of removing any unreacted metal, and the step of providing a second thermal budget for completion of the conversion of said semiconductor material into silicide.

In particular this optimized 2-step RTP process can be used for FUSI gates (more particularly $Ni_xSi_y$ FUSI gates) to achieve uniform phase control at different gate lengths.

The gate dielectric layer can be a layer of electrically insulating material, such as $SiO_2$, SiN, or SiON, formed by any suitable method, such as chemical vapor deposition (CVD).

Preferably, the gate dielectric is a layer a high-k dielectric material, such as HfSiON.

The gate electrode (before silicidation) is advantageously formed from a polysilicon layer deposited on the gate dielectric. The gate electrode is advantageously deposited by a chemical vapor deposition (CVD) method, followed by patterning and etching.

The spacers are formed from an insulating material such as silicon dioxide ($SiO_2$), silicon nitride (SiN), or silicon oxynitride (SiON).

The spacers are advantageously deposited and patterned by any art recognized method, such as CVD followed by anisotropic etching.

The metal layer advantageously comprises Ni atoms. The use of other metals is possible within the scope of the preferred embodiments. For instance, Co, Ti, and Pt are other suitable metals for forming silicides.

The metal layer can be deposited by any method known in the art.

The advantages of a method according to the preferred embodiments using lanthanide(s) ions implantation over implantation with other species currently used (e.g., As, P, Sb) are that it is more effective in reducing the effective work function of metal gates, in particular of metal gates on high-k dielectrics such as HfSiON, and of preventing adhesion or peeling problems.

The introduction of said lanthanide(s), more particularly Yb, by ion implantation is more advantageous than the deposition of a layer of said lanthanide(s).

One advantage is an easier implementation into CMOS flows for which the lanthanide(s) (more particularly Yb) is/are only desired in the NMOS devices. For lanthanide(s) co-deposition (more particularly Yb) this would mean the need for two separate deposition steps on NMOS and PMOS. For ion implantation only a masked implant is required.

Another advantage is that a much lower amount of lanthanide(s) is used, making the process much more similar to the pure metal silicidation (e.g., Ni silicidation).

Another advantage is the higher efficiency with which the lanthanide(s) is/are segregated to the dielectric interface, making the method using ion implantation according to the preferred embodiments more efficient to reduce the work function (i.e., same work function reduction for much less total amount of Yb for example).

According to a preferred embodiment, the lanthanide used is Yb, implanted into a polySi layer.

The metal used is Ni, to obtain a fully silicided gate.

The silicide phase is preferably NiSi, but any Ni-rich silicide is also contemplated (such as $Ni_2Si$, etc).

For example, for 100 nm poly, energies in the 40-60 keV range and doses of 2E15 to 6e15 can be used.

Optionally, the implanted Si can be annealed before metal deposition for silicidation. Such anneal could be a spike or soak activation anneal at temperatures in the 900-1100° C. range for example.

The step of full silicidation of the gate can thus be performed.

In relation to the drawings, the preferred embodiments are described in detail in the following. It is apparent however that a person skilled in the art can imagine several other equivalent embodiments or other ways of executing the preferred embodiments.

Figure 1B:
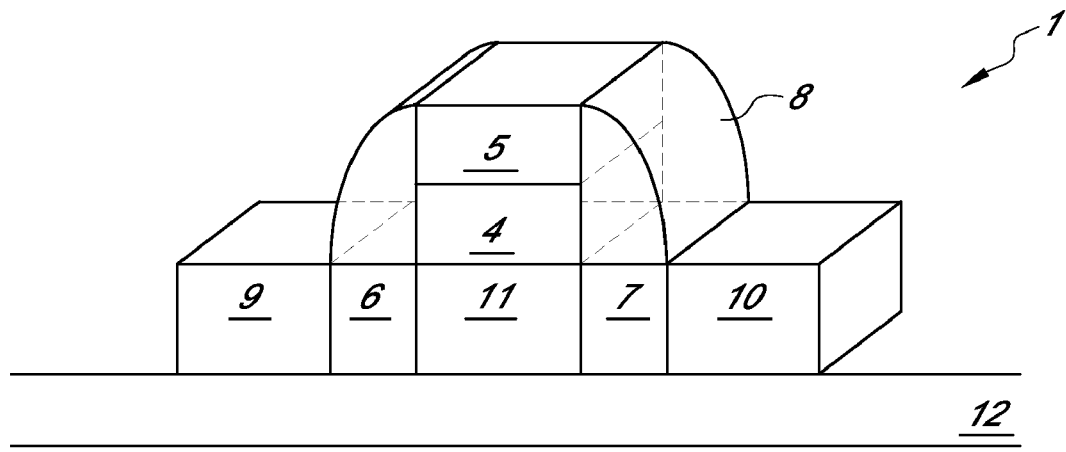

FIGS. 1a and 1b show a schematic cross-sectional view of n-type Metal-Oxide-Semiconductor Field Effect Transistors (nMOSFET) according to the preferred embodiments.

An nMOS device of the preferred embodiments comprises a gate stack formed on a semiconducting layer (2) The gate stack comprises a gate dielectric (4) in contact with this semiconducting layer (2) and a gate electrode (5) in contact with this gate dielectric (4).

The gate dielectric can be a silicon-oxide, a silicon-oxynitride ($Si_xO_yN_{1-x-y}$), a high-k dielectric (k>3.9) such as hafnium or aluminum silicates or oxides, e.g., $HfO_2$, $Al_2O_3$.

The gate electrode (5) comprises a low work function metallic alloy. This low work function metallic alloy comprises one, two or more of the lanthanides, a suitable metal for silicidation and a semiconductor comprising Si, Ge or SiGe.

A preferred low work function metallic alloy of the preferred embodiments comprises nickel, ytterbium and silicon.

An alloy of the preferred embodiments can be represented by the formula $Ni_xYb_ySi_{1-x-y}$, where x and y are real numbers, and can range respectively from 0.3 to 0.7 and from 0.005 to 0.2 (e.g., 0.3<x<0.7, and 0.005<y<0.2). Preferably x=0.55 and y=0.12.

The nMOS device can further comprise spacers (8) formed adjacent the gate stack (4, 5) and junction regions (6, 7, 9, 10).

The preferred embodiments can be applied to various device architectures. FIG. 1a shows an example of an NMOS-FET device formed on a bulk substrate 2 while FIG. 1b shows a MugFET nMOS, e.g., a multiple gate FET such as a FinFET, formed upon the dielectric (12) of a SOI substrate.

FinFet devices are known in the art as discussed in European Patent Application EP 1383166.

FIG. 2 illustrates by means of schematic cross-sections a process for manufacturing devices according to the preferred embodiments. For the purpose of illustrating this process a bulk nMOSFET is used (represented) although the preferred embodiments is not intended to be limited thereto.

Figure 2A:
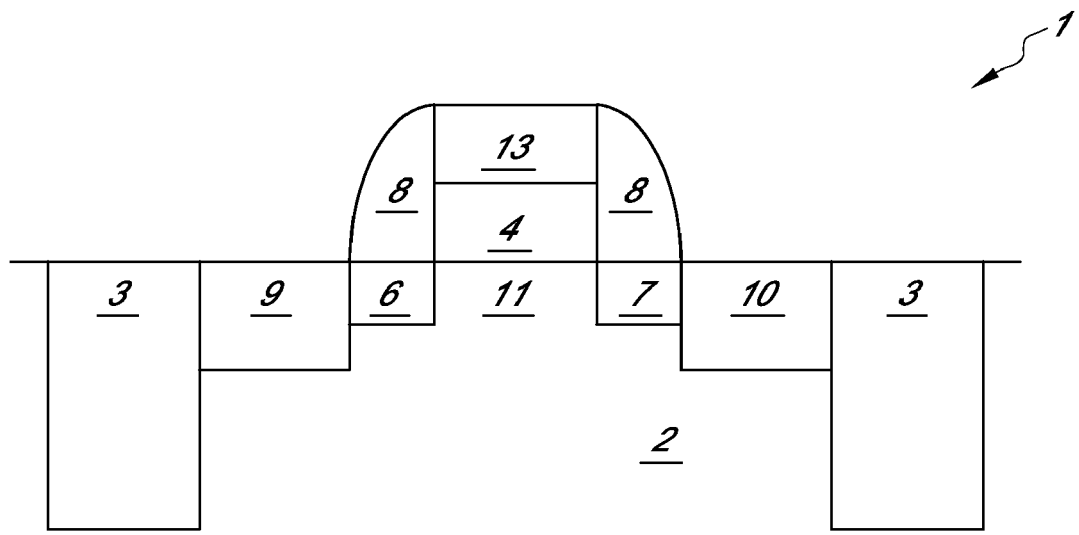
FIG. 2 a-g show schematic cross-sections of a device according to the preferred embodiments illustrating different steps in the manufacturing process.

FIG. 2a shows a cross-section of the nMOSFET after the spacers (8) after formed. A method of the preferred embodiments can comprise the steps of forming a gate stack (4, 13), and spacers (8) adjacent this gate stack.

Spacers can be formed from silicon-oxide, silicon-oxynitride ($Si_xO_yN_{1-x-y}$), silicon nitride, silicon carbide or from a combination of these materials.

At opposite sides of this gate stack n-type source/drain junction regions are formed, typically as a combination of extension regions (6, 7) underneath the spacers (8) and connection regions (9, 10) adjacent these extension regions and aligned to the spacers (8).

Dielectrically coupled to the gate stack, a channel region (11) is present in the semiconductor layer, which in this case is the semiconductor substrate itself (2).

The active area region (not indicated) in which the transistor (1) is formed, is separated from other active area regions by so-called field regions (3) formed by known techniques such as Local Oxidation of Silicon (LOCOS) or Shallow Trench Insulation (STI).

The gate dielectric (4) can be a silicon-oxide, a silicon-oxynitride ($Si_xO_yN_{1-x-y}$), an high-k dielectric such as Hafnium or Aluminum silicates or oxides, e.g., $HfO_2$, $Al_2O_3$.

The gate electrode (13) is formed in a semiconductor material. This semiconductor material is preferably silicon. This silicon can be in a monocrystalline, polycrystalline or amorphous state. The thickness of the gate electrode (13), i.e., the amount of semiconductor material available, can be determined in view of the desired composition of the later-formed silicide as will be shown later.

Figure 2B:
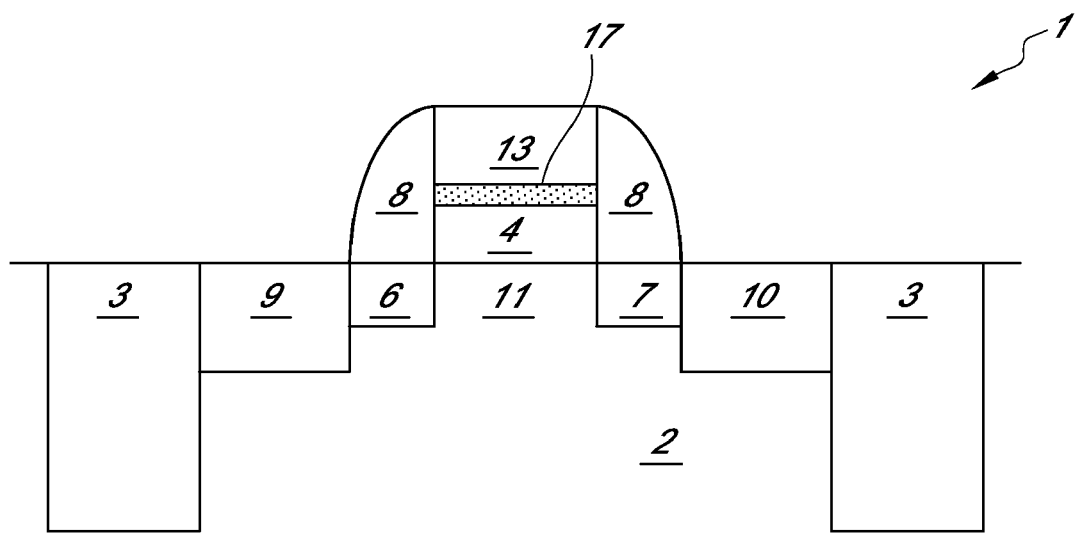

As shown in FIG. 2b a diffusion barrier layer (17) can be present in between the gate electrode (13) and the gate dielectric (4). This diffusion barrier (17) will prevent diffusion of the lanthanide, more particularly of ytterbium, into the gate dielectric (4) during the silicidation process. An example of such diffusion barrier (17) is silicon-nitride.

Figure 2C:
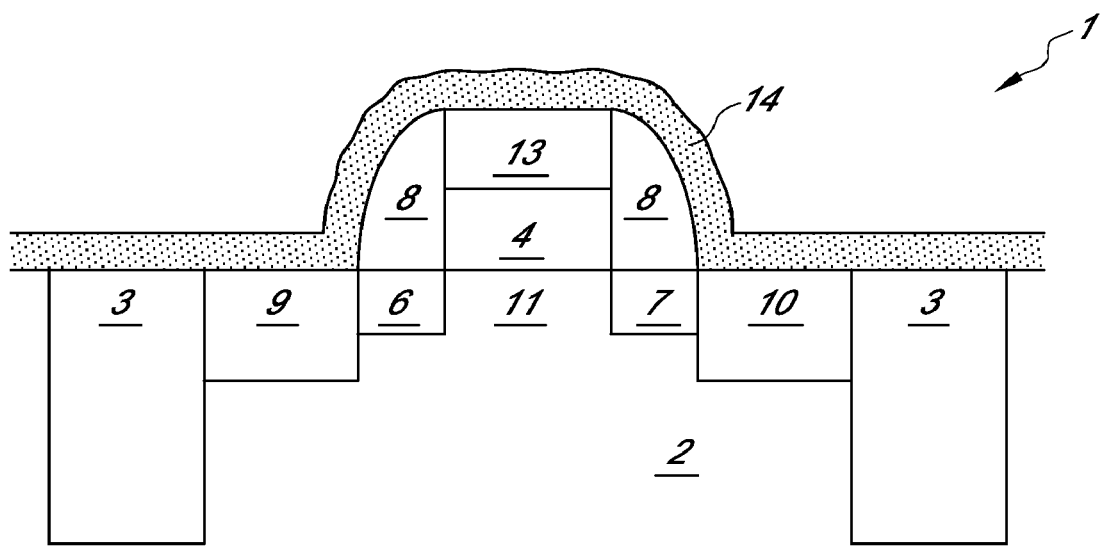

A layer or stack of layers (14) comprising said lanthanide (s) and said metal, preferably nickel and ytterbium, is deposited over the device as illustrated in FIG. 2c.

The layer stack (14) can be in the form of single layer comprising an alloy having the desired composition, i.e., the ratio lanthanide(s)/metal (e.g., the ratio nickel/ytterbium), and the desired total amount of lanthanide(s) and metal (e.g., nickel and ytterbium), i.e., layer thickness.

This single layer can be obtained for example by simultaneously sputtering said lanthanide(s) and metal (e.g., nickel and ytterbium) from their respective targets on the substrate at predetermined deposition rates or by sputtering an alloy of lanthanide(s) and metal (e.g., nickel ytterbium) having the desired composition on the substrate.

The layer stack (14) can be in the form of a stack of layers e.g., by sequentially sputtering layers of respectively lanthanide(s) and metal (e.g., nickel and ytterbium) whereby the thickness of the individual layers determines the amount of lanthanide(s) and metal (e.g., nickel and ytterbium) available and the ratio of the layer thickness determines the ratio of lanthanide(s)/metal (e.g., nickel/ytterbium ratio).

Figure 2D:
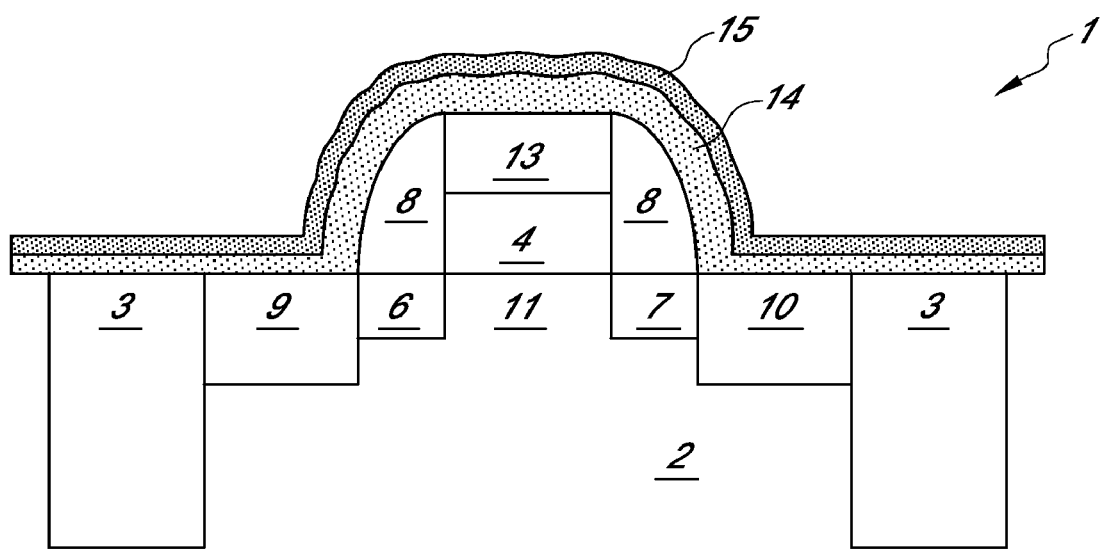

Optionally a capping layer (15) is deposited on the layer stack (14) as shown in FIG. 2d. This capping layer prevents oxidation of the lanthanide(s) (e.g., ytterbium) during the subsequent silicide forming annealing process. The material of this capping layer must have oxygen diffusion barrier properties and be substantially oxide free. Preferably this capping layer comprises HfN.

The layer stack (14) can be formed by sequentially sputtering layers of lanthanide(s) and metal (e.g., first depositing ytterbium and covering the deposited ytterbium layer with nickel), whereby the top layer (e.g., Ni) can act as an oxygen diffusion barrier (15) and no additional capping layer is needed.

Alternatively, lanthanide(s) and metal (e.g., nickel and ytterbium) can be co-deposited or an alloy of lanthanide(s) and metal (e.g., nickel and ytterbium) can be sputtered, and a metal layer (e.g., nickel layer) can be used as capping layer thereby avoiding the need for a separate capping layer (15) and corresponding etching steps to remove such additional capping layer.

After depositing the lanthanide(s) and metal (e.g., nickel and ytterbium) in the desired amounts and ratio upon the substrate the silicidation process is performed.

preferably, nickel and ytterbium from the layer stack (14) and silicon from the gate electrode (13) react with each other to form a metallic nickel-ytterbium silicide.

During the annealing process the semiconductor gate electrode (13) is transformed in a metallic silicided gate electrode (e.g., into a nickel-ytterbium silicon gate electrode) (5).

The composition of this alloy depends on the relative amounts available of lanthanide(s), metal and semiconductor (e.g., nickel, ytterbium and silicon).

The conditions of this silicidation process, e.g., time and temperature of this annealing process, are chosen such that substantially the complete semiconductor gate electrode (13) is converted into a metallic gate electrode (5) resulting in a so-called Fully Silicided gate electrode (FUSI). Preferably, the silicide forming temperature is from about 350° C. to about 600° C., more preferably about 400° C. while the duration of the silicide forming process is preferably from about 30 s to about 90 s, preferably about 60 s.

After fully siliciding the gate electrode (13), the unreacted metals (e.g., nickel and ytterbium) are removed selectively to underlying layers such as the silicide (16), the spacers (8) and the field regions (3).

Preferably, for nickel, the selective removal is performed by a wet etch of about 5 minutes using an etchant comprising $HNO_3$.

If a capping layer (15) is present, first this capping layer is preferably selectively removed before removing the unreacted metals.

If HfN is used to form the capping layer, preferably a wet etch using an etchant such as diluted HF is used to selectively remove the HfN capping layer.

Figure 2E:
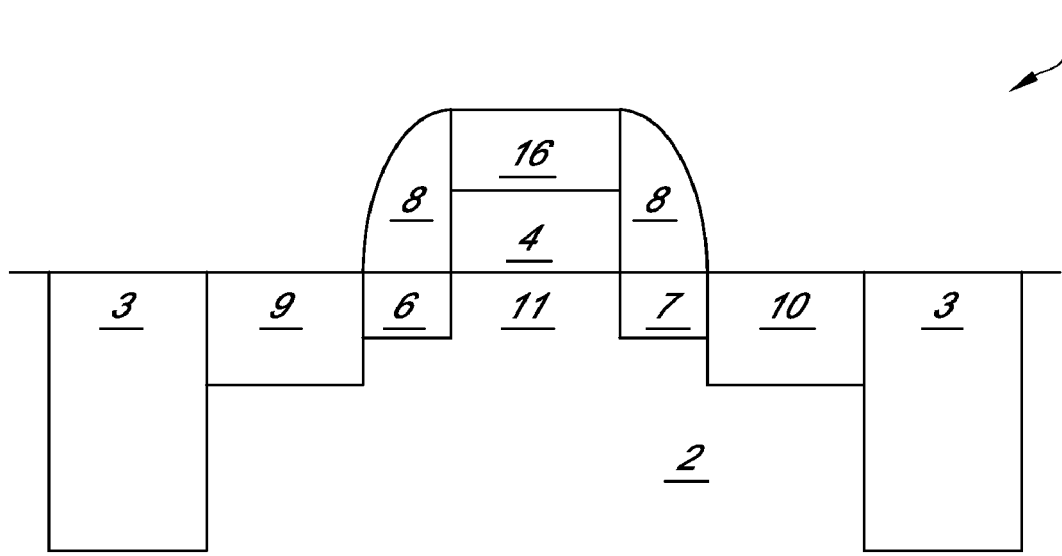

FIG. 2e shows the device comprising the FUSI gate electrode (5) after selectively removing the unreacted lanthanide (s) and metal (e.g., nickel and ytterbium) and the capping layer if present.

According to an embodiment, on p-type silicon substrates (2) MOS capacitors are fabricated by first depositing a SiON dielectric layer (4) thereon.

On top said dielectric layer (4) undoped polysilicon (13) is deposited, preferably using Chemical Vapor Deposition (CVD).

On top of said polysilicon layer a layer stack (14) of ytterbium (Yb) (14a) and nickel (Ni) (14b) are deposited, preferably by Plasma Vapor Depositing (VPD) in an Argon ambient.

Both Ni and Yb can be co-sputtered and then the deposition of Yb can be stopped while the deposition of Ni is continued.

On top of the Ni—Yb layer stack, a Hafnium Nitride (HfN) layer (15) is deposited. This HfN layer (15) is used as capping layer to avoid oxidation of Yb during the subsequent annealing step needed to have the Ni—Yb react with the underlying polysilicon thereby forming a nickel-ytterbium silicide.

The silicide forming process is preferably performed in vacuum (10e-5 torr, e.g., 1.33×10e-5 mbar) at about 400° C. for about 1 minute.

After the full silicidation of the gate, the HfN capping layer is selectively removed, preferably by a wet etch, e.g., of about 5 minutes, e.g., using diluted HF solution.

Then the remaining unreacted metal, Ni and/or Yb, is selectively removed, preferably by a wet etch, e.g., of about 5 minutes, e.g., using dilute $HNO_3$.

Figure 2F:
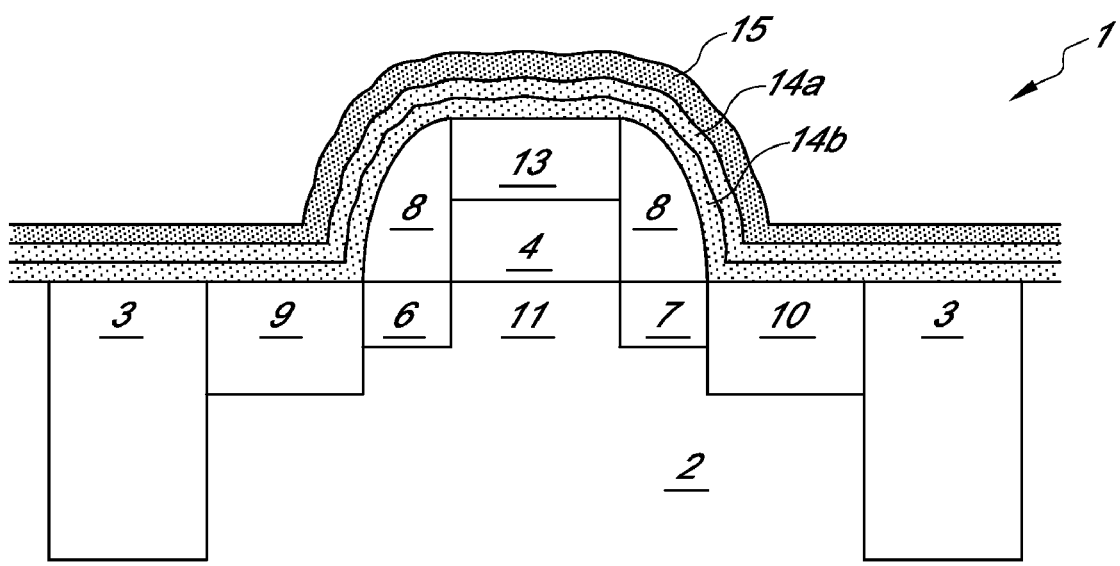
Figure 2G:
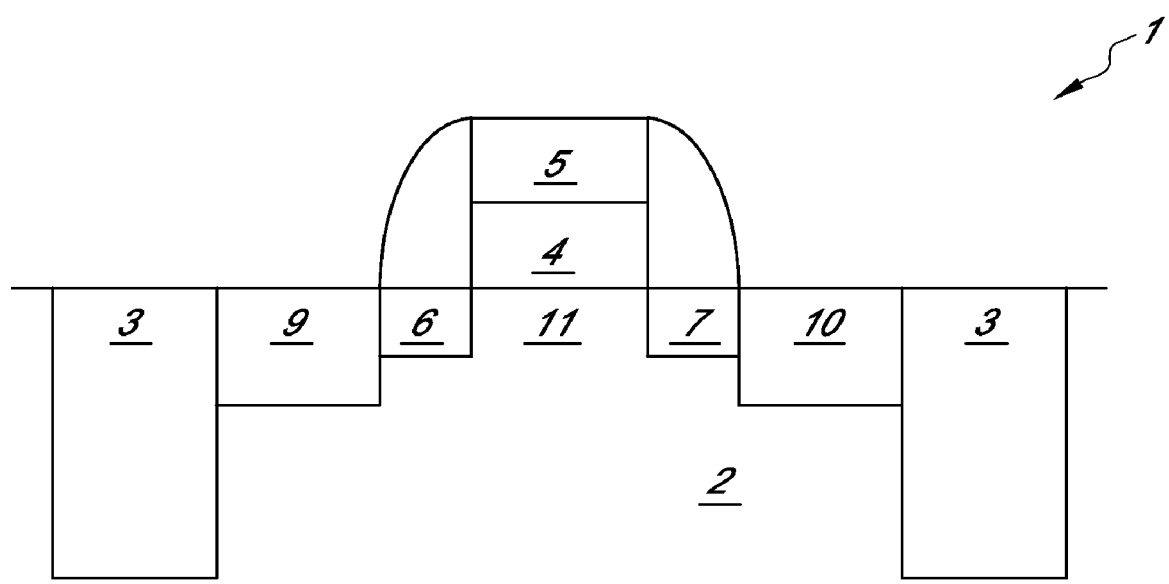

As a result of this processing MOS capacitors are obtained having a FUSI nickel-ytterbium-silicide gate electrode (5) on top of a SiON gate dielectric (4) formed on p-type substrates (2), as depicted in FIG. 2g.

Preferably, in said nickel-ytterbium-Silicide represented by the formula $Ni_xYb_ySi_{1-x-y}$, x is equal to 0.55, and y is equal to 0.12.

Figure 3:
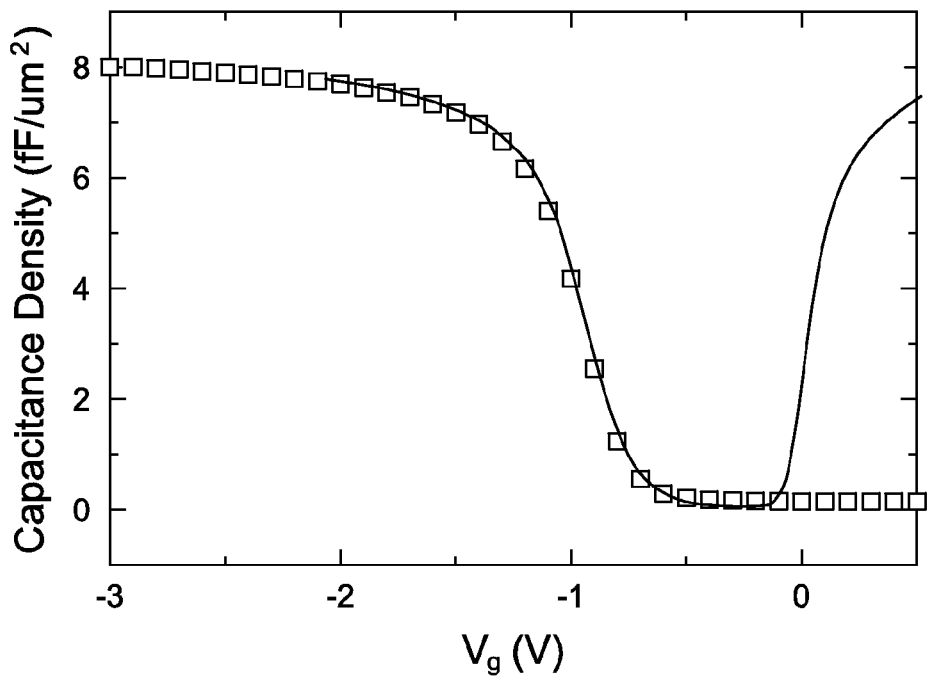
FIG. 3 shows measured and simulated capacitance C versus gate voltage $V_g$ data for a capacitor with FUSI gate according to the preferred embodiments.

FIG. 3 shows the measured and simulated C ($fF/\mu m^2$)–$V_g$ (V) data for a 100 by 100 $\mu m^2$ capacitor processed as described in the example section. The flat-band voltage $V_{fb}$ is extracted to be about −0.8V. The complete silicidation of the polysilicon layer is confirmed by comparing the extracted Equivalent Oxide Thickness (EOT) value of 3.75 nm with the physical thickness of the dielectrics determined by ellipsometry. From this comparison one can conclude that no depletion effect occurs at the gate electrode side and that gate capacitance measured during the positive bias of the gate electrode with respect to substrate corresponds to the capacitance of the gate dielectric. The good matching between the measured data (open squares) and the fitted data (solid line) shows that essentially no interface states $D_{it}$ are present in between the FUSI gate electrode and the SiON gate dielectric.

Figure 4:
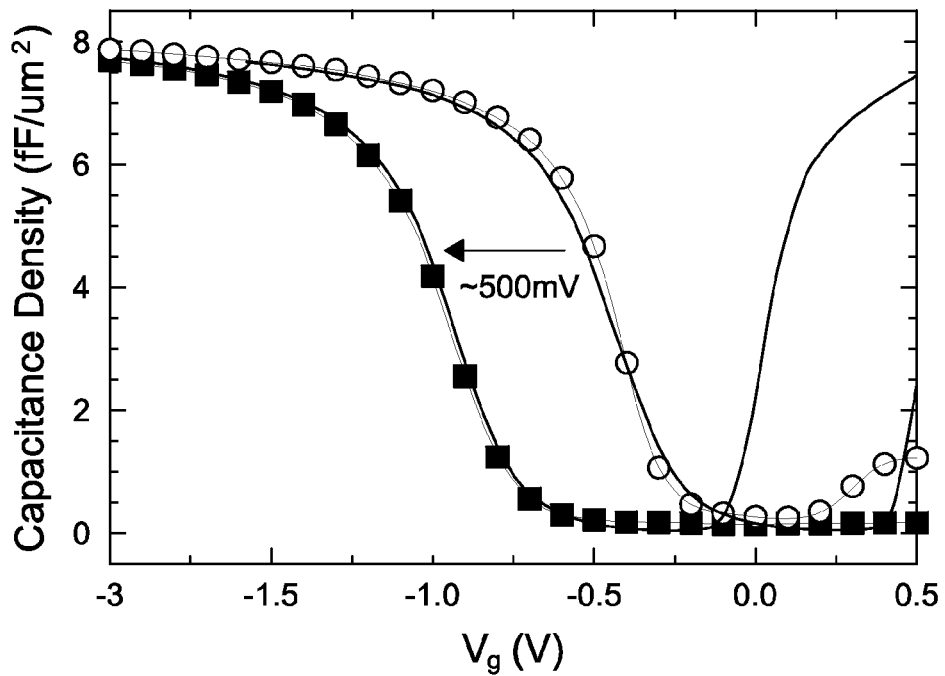
FIG. 4 shows measured (lines) and simulated (symbols) capacitance C versus gate voltage $V_g$ data for a capacitor with FUSI gate according to the preferred embodiments (solid squares) and for a capacitor with a prior art nickel-silicide FUSI gate (circles).

FIG. 4 compares the measured and simulated (solid line) C ($fF/\mu m^2$)–$V_g$ (V) data for a 100 by 100 $\mu m^2$ capacitor having a nickel-ytterbium-silicon FUSI gate (solid squares) with the measured and simulated C ($fF/\mu m^2$)–$V_g$ (V) data for a similar, 100 by 100 $\mu m^2$ capacitor but having a prior art nickel-Silicide (NiSi) FUSI gate (open circles), Due to the presence of the nickel-ytterbium-silicon FUSI gate the C-$V_g$ curve is shifted about 500 mV towards more negative gate voltages. This voltage shift illustrates that the low work function metal according to the preferred embodiments exhibits n-type electronic properties and that it is suitable as electrode material for nMOS devices.

Figure 5:
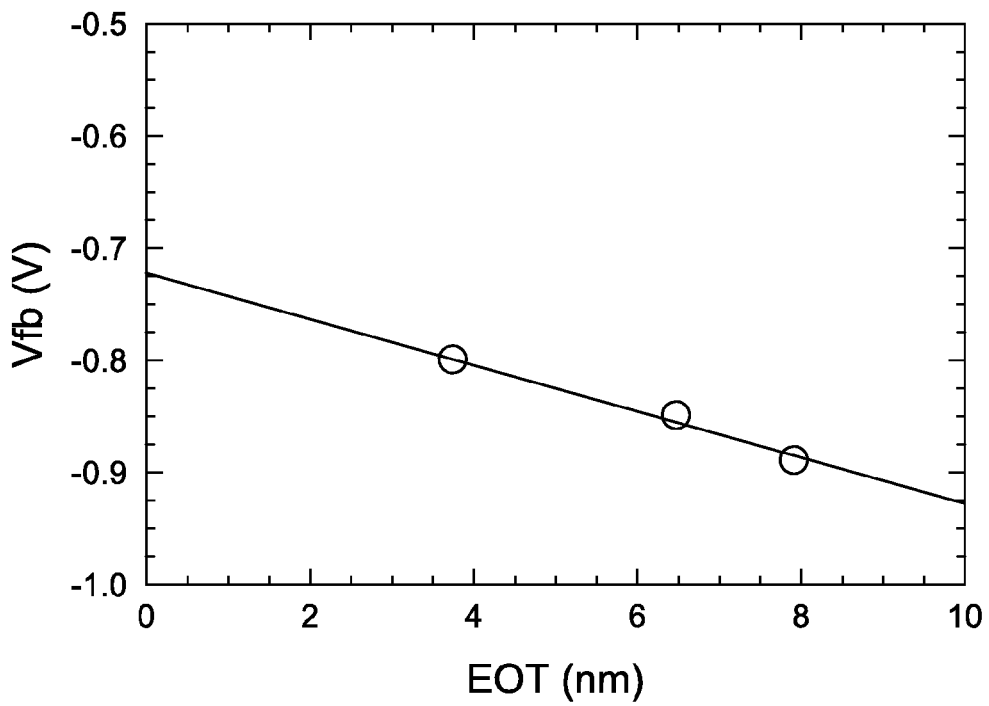
FIG. 5 shows Equivalent Oxide Thickness (EOT) vs. Flatband voltage $V_{fb}$ data for capacitors with a FUSI gate electrode according to the preferred embodiments.

From the relationship between the experimentally obtained (circles) Equivalent Oxide Thickness (EOT) and the flat-band voltage ($V_{fb}$) shown in FIG. 5, the work function value of nickel ytterbium silicon FUSI on SiON dielectric is extracted by a linear fit (solid line) as 4.22 eV. The work function of nickel-ytterbium-silicon on SiON is about 4.22 eV, which makes this material suitable to be used as the gate electrode for n-MOSFETs.

In another embodiment capacitor structures were processed which are similar to the capacitor structures disclosed in the example section. However the composition of the nickel ytterbium silicon FUSI gate was varied and several approaches to form the as-deposited nickel ytterbium metal stack were used.

On various capacitor structures nickel-ytterbium metal stacks were deposited having substantially the same as-deposited stack thickness of about 80 nm but with different nickel/ytterbium thickness ratios.

As was done in the example section, the thickness of the nickel and of the ytterbium layer is controlled by the rate and time at which nickel, respectively, ytterbium are co-sputtered.

Figure 6:
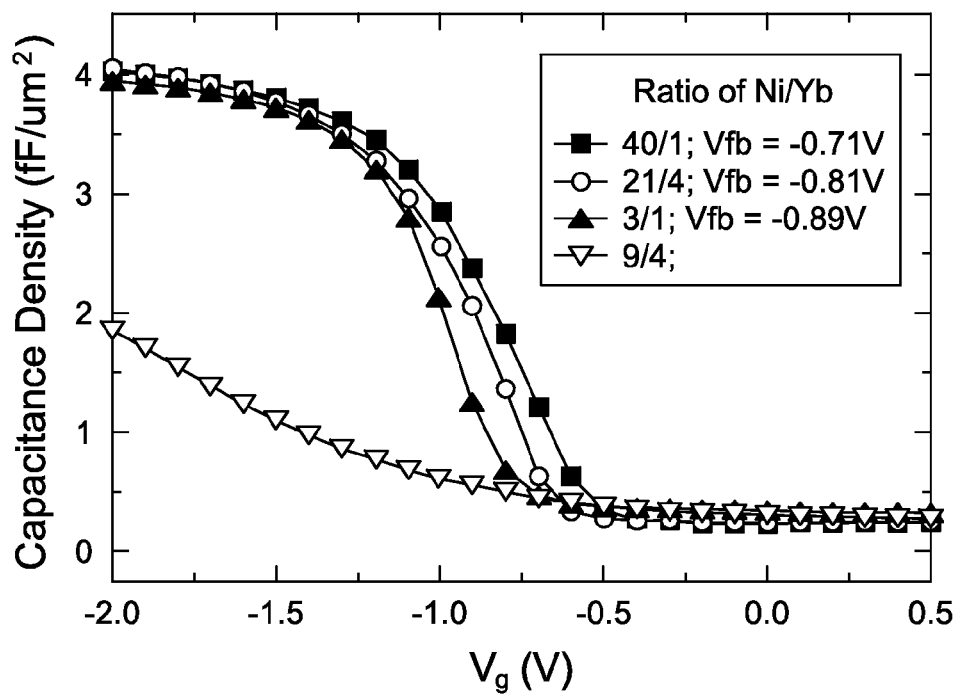
FIG. 6 shows measured (lines) and simulated (symbols) capacitance C versus gate voltage $V_g$ data for capacitors with a FUSI gate according to the preferred embodiments, whereby the nickel/ytterbium ratio in the as-deposited layer was varied from one capacitor to another.

FIG. 6 shows the effect of the nickel ytterbium silicon composition on the C-V characteristics of these structures.

The equivalent oxide thickness of these capacitor structures is determined as being about 7.9 nm.

Compared to the C-V curve of a nickel-silicon FUSI gate shown in FIG. 4 (open circles) the C-V curve is shifted to negative gate voltages from a Ni/Yb thickness ratio as low as 40/1 having a flat-band voltage $V_{fb}$ of −0.71V (solid squares).

Increasing the relative amount of ytterbium in the metal stack shifts the flat-band voltage to even more negative gate voltages: Ni/Yb=21/4 (open circles) with $V_{fb}$ of −0.81V, Ni/Yb=3/1 (upward diamond) with $V_{fb}$ of −0.89V.

However if too much ytterbium is incorporated, no meaningful flat-band voltage could be extracted from the corresponding C-V curve.

On various capacitor structures nickel-ytterbium metal stacks were deposited having substantially the same as-deposited stack thickness of about 80 nm and substantially the same nickel/ytterbium thickness ratio of 4/1.

The nickel-ytterbium metal stack (14) was formed either by simultaneous depositing the nickel and ytterbium as was done in the example section or by sequentially depositing both metals, e.g., first depositing the ytterbium layer and afterwards forming the nickel layer.

The equivalent oxide thickness of these capacitor structures is determined as being about 7.9 nm.

Figure 7:
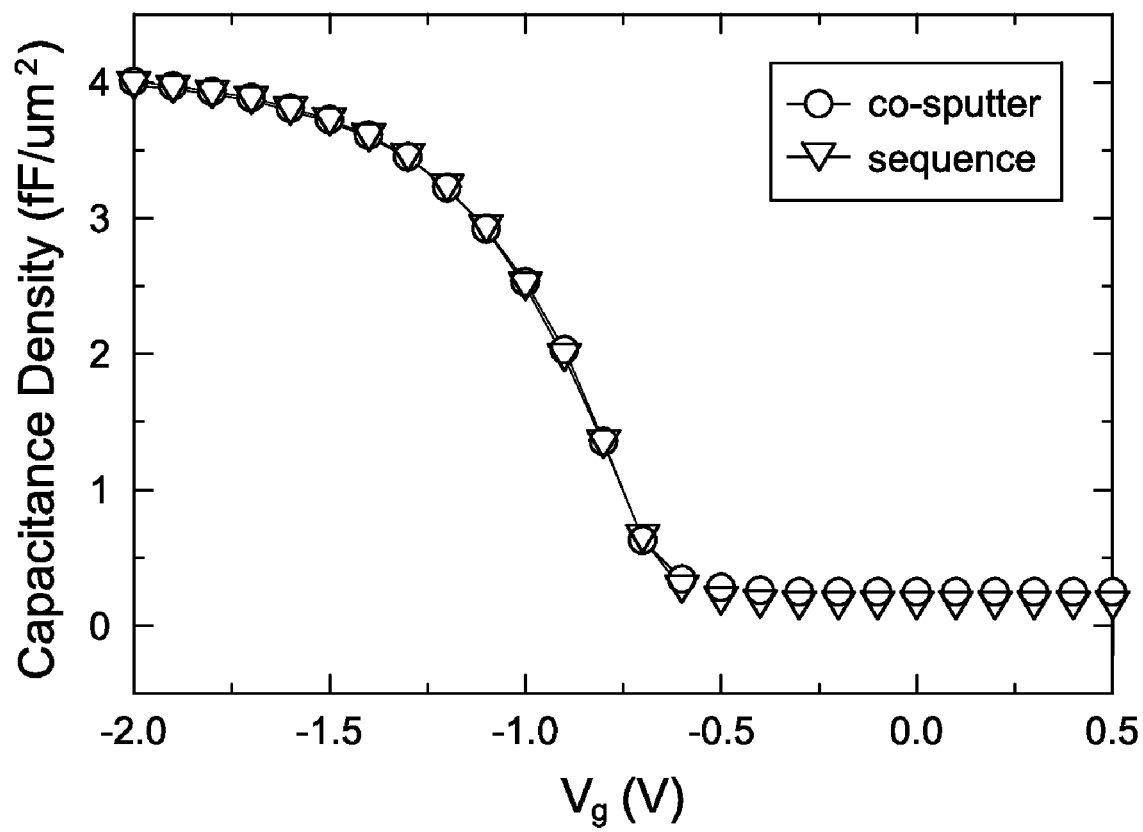
FIG. 7 shows measured (lines) and simulated (symbols) capacitance C versus gate voltage $V_g$ data for capacitors with a FUSI gate according to the preferred embodiments, whereby nickel and ytterbium was either co-deposited (circles) or sequentially deposited (diamond).

FIG. 7 shows the effect of the deposition method on the C-v characteristics of these structures.

If nickel and ytterbium are co-sputtered (open circles) a flat-band voltage of about −0.81V is obtained.

If nickel and ytterbium are deposited in a sequential way (open diamonds) the corresponding C-V curve coincides with the C-V curve obtained for the co-sputtered metal stack (open circles) and a flat-band voltage of about −0.81V is obtained.

From FIGS. 6 and 7 it is clear that the electric properties of a nickel-ytterbium-silicon FUSI gate are in first instance function of the relative amounts of nickel and ytterbium present in the as-deposited metal stack.

This metal stack can be formed using various ways without substantially affecting the electronic properties of the resulting FUSI gate.

Figure 8A:
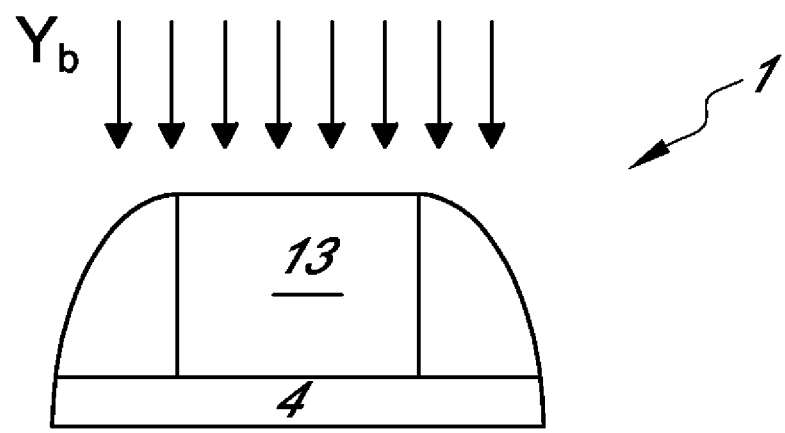
FIGS. 8a and 8b shows schematic cross-sections of a precursor device illustrating a method according to the preferred embodiments for reducing the work function of a metal gate.
Figure 8B:
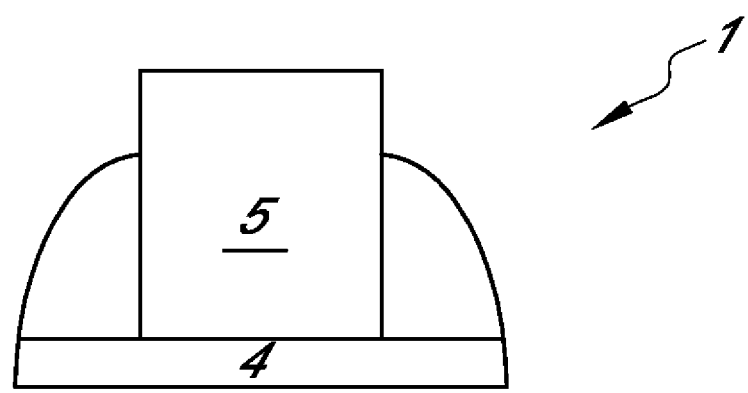

FIG. 8a shows a precursor nMOS device (1) in which Yb ions are implanted into a gate electrode (13) comprising silicon. This gate electrode can further comprise nickel. In particular the gate electrode is a nickel silicide. In a subsequent step the implanted gate electrode (5) is converted into a nickel-ytterbium-silicide by using thermal processing resulting in the device illustrated by FIG. 8b.

Figure 9A:
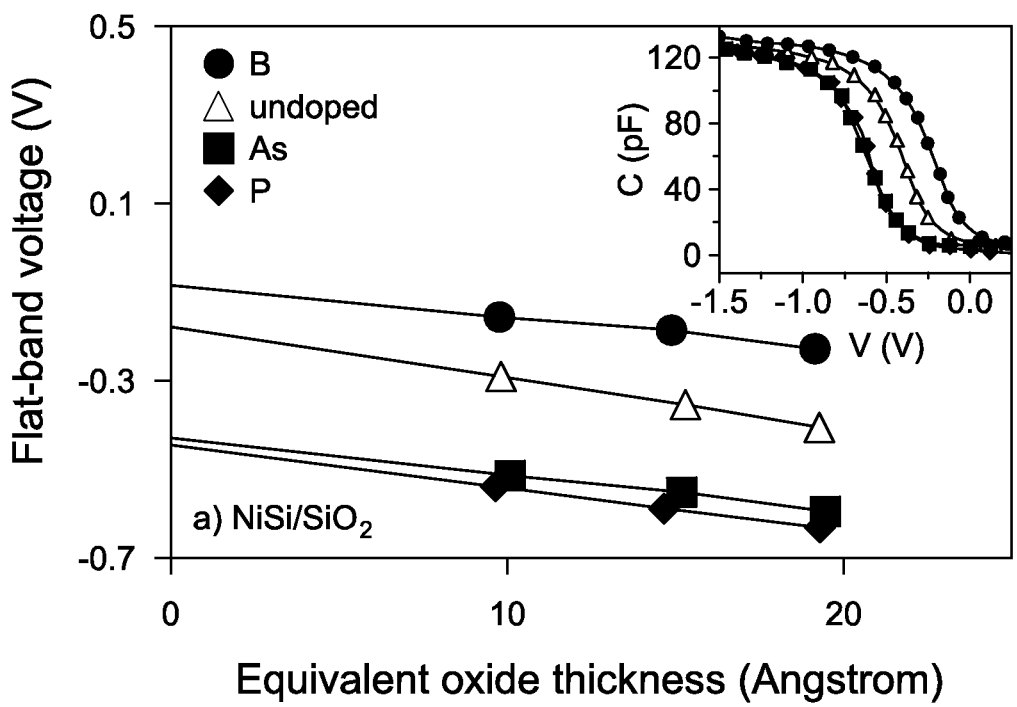
FIGS. 9a and 9b show flat-band voltage (V) versus EOT data for a As, P or Sb implanted NiSi FUSI gate respectively on $SiO_2$ and HfSiON dielectric gate.
Figure 9B:
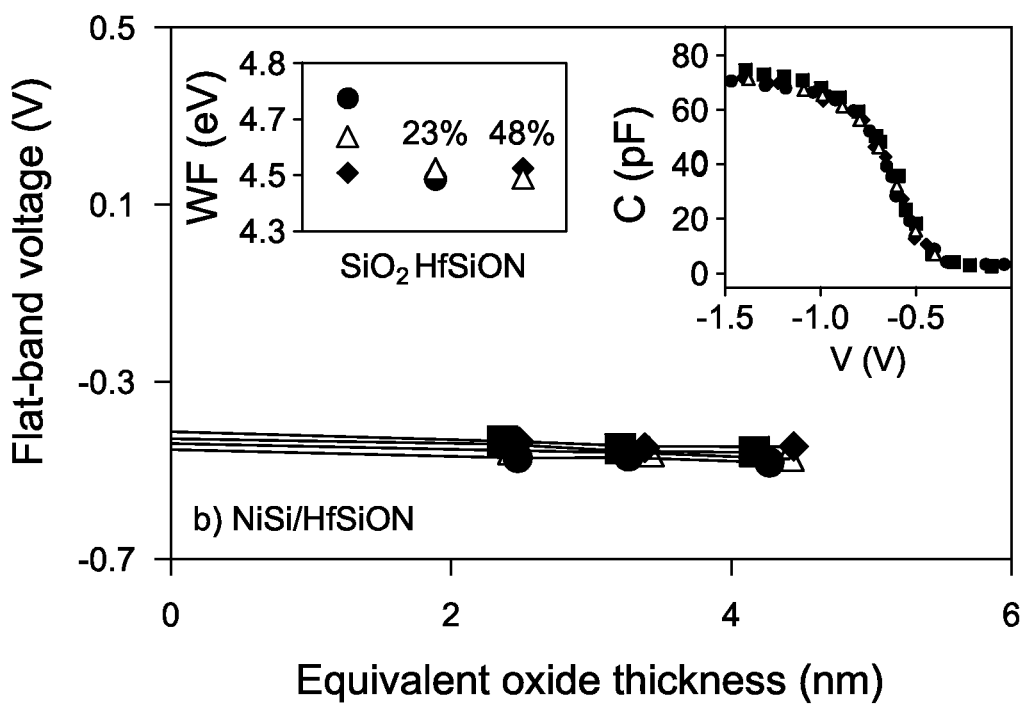

FIG. 9 shows the flatband voltage of an nMOS transistor as function of the equivalent oxide thickness for a nickel silicide/silicon oxide gate stack (a) or for a nickel silicide/hafnium silicon oxide gate stack (b). Each of FIGS. 9a and 9b contains an inset showing the capacitance-voltage curves from which the flatband voltages are extracted.

For FIGS. 9a and 9b the flatband voltage for various doping conditions of the gate electrode are shown: undoped or respectively Boron, Arsenic, Phosphorous doped. For every condition the flatband voltage varies with oxide.

Figure 10A:
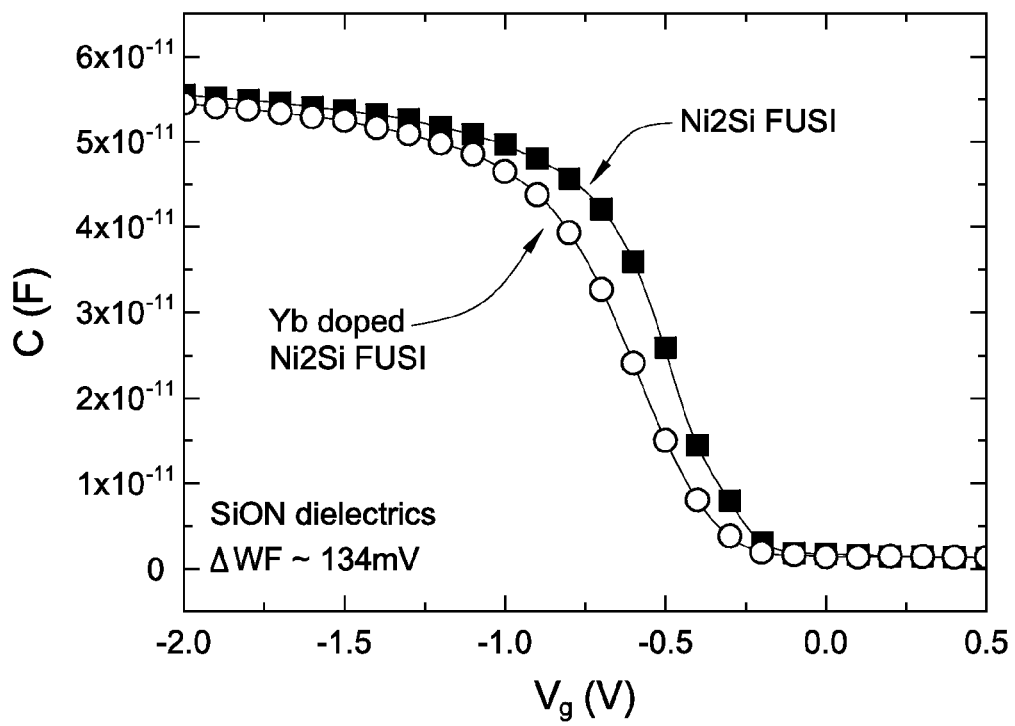
FIGS. 10a-d show capacitance C versus gate voltage $V_g$ data, wherein the work function could be modulated to n-type by ion implantation of Yb into, respectively, (a) NiSi FUSI gate on SiON dielectric, (b) $Ni_2Si$ FUSI gate on SiON dielectric, (c) NiSi FUSI gate on HfSiON dielectric, and (d) $Ni_2$(SiGe) FUSI gate on HfSiON dielectric.
Figure 10B:
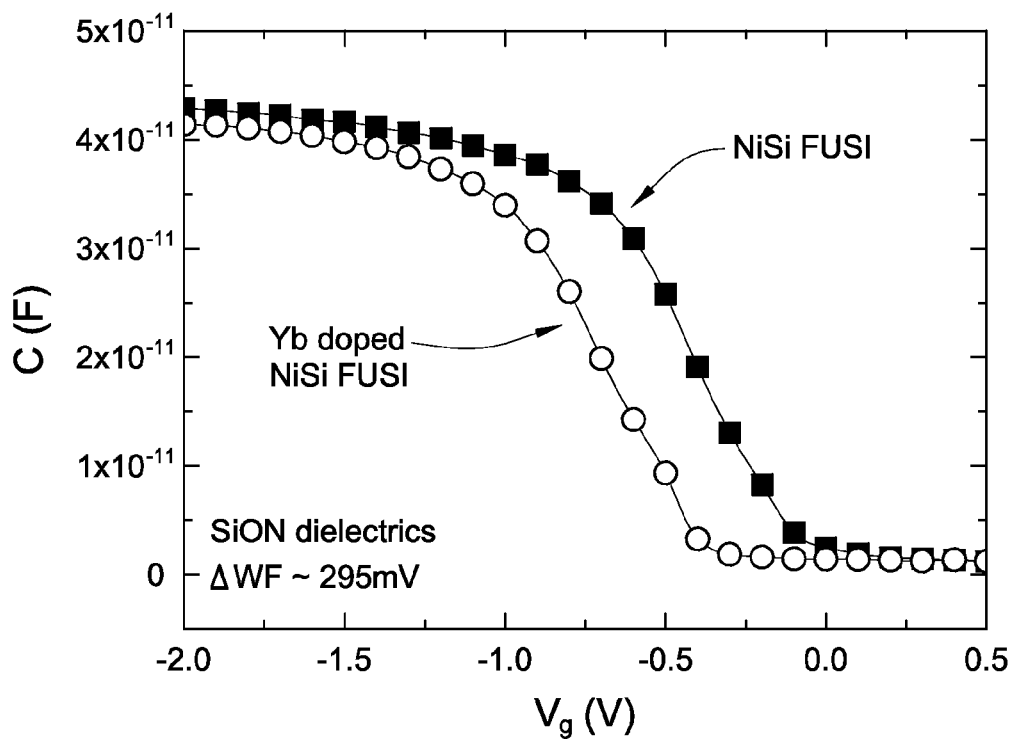
Figure 10C:
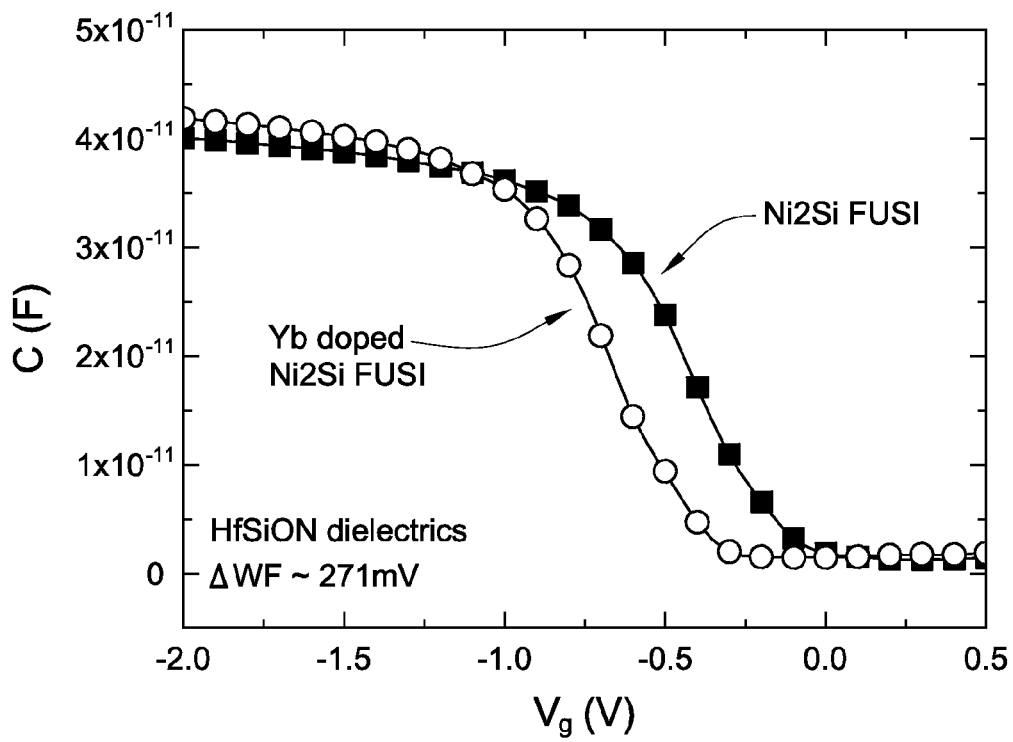
Figure 10D:
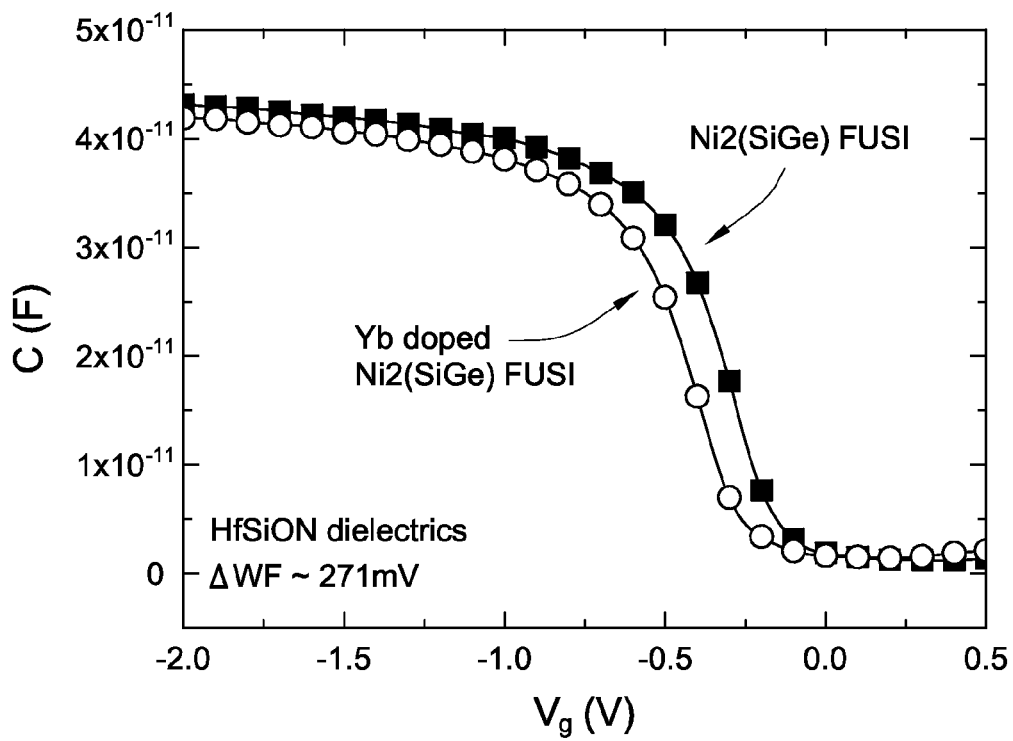

FIGS. 10a-d show the capacitance voltage curves for Yb doped fully nickel silicided gate electrode (5) formed on a silicon oxide nitride dielectric layer (4) (FIGS. 10a, 10b) or on a hafnium silicon oxide nitride dielectric layer (4) (FIGS. 10c, 10d). The nickel silicide can be a $Ni_{0.5}Si_{0.5}$ (FIGS. 10a, 10c) or $Ni_2Si_1$ (FIGS. 10b, 10d). In every figure a comparison is made with undoped nickel silicide counterpart and the difference in work function between the Yb doped and undoped nickel silicide is given at the bottom of each figure.

The preferred embodiments hence relate to a low work function metal comprising at least one lanthanide, a metal and a semiconductor, more particularly comprising nickel, ytterbium and silicon.

This low work function metal can be used as n-type gate electrode material, for example to form the gate electrode of an nMOSFET.

The methods of the preferred embodiments allow the formation of electronic circuits comprising nMOSFETs and pMOSFETs, wherein the gate electrode of the nMOSFETs is formed according to the preferred embodiments.

EXAMPLE

In an embodiment as depicted in FIG. 2f, the formation of a NiYb silicide is disclosed.

On p-type silicon substrates (2) MOS capacitors were fabricated by first depositing a SION dielectric layer (4) thereon.

SiON layers with various thicknesses have been formed on various wafers.

On top of each dielectric layer (4) undoped polysilicon (13) is deposited using Chemical Vapor Deposition (CVD).

The polysilicon layer (13) had a thickness of about 100 nm. On top of each polysilicon layer a layer stack (14) of ytterbium (Yb) (14a) and nickel (Ni) (14b) was deposited by Plasma Vapor Depositing (VPD) in an argon ambient. Yb was deposited at a rate of about 10 nm/min, and Ni at a rate of about 17 nm/min.

Firstly both Ni and Yb were co-sputtered for 1.5 min. Then the deposition of Yb was stopped while the deposition of Ni was continued for another 2.5 min.

In total about 68 nm of Ni and about 15 nm of Yb was deposited resulting in a total metal layer thickness of about 80 nm.

On top of the Ni—Yb layer stack (14) a Hafnium Nitride (HfN) layer (15) of about 50 nm was deposited. This HfN layer (15) is used as capping layer to avoid oxidation of Yb during the subsequent annealing step needed to have the Ni—Yb react with the underlying polysilicon thereby forming a nickel-ytterbium silicide.

The silicide forming process was performed in vacuum (10e-5 torr, e.g., $1.33 \times 10e-5$ mbar) at about 400° C. for about 1 min.

After the fully silicidation of the gate the HfN capping layer was selectively removed by a wet etch of about 5 minutes using diluted HF solution. Then the remaining unreacted metal, Ni and/or Yb, was selectively removed by a wet etch of about 5 minutes using dilute $HNO_3$.

As a result of this processing MOS capacitors are obtained having a FUSI nickel-ytterbium-silicon gate electrode (5) on top of a SiON gate dielectric (4) formed on p-type substrates (2), as depicted in FIG. 2g.

The resulting nickel-ytterbium-silicon gate electrode layer had a thickness of about 110 nm to 120 nm with a smooth interface with the underlying SiON gate dielectric. The average sheet resistance $R_s$ of this gate electrode layer (5) was about $5.5\Omega^2$ which is comparable to the sheet resistance of a nickel-silicon gate electrode layer. Using Auger—Electron-Spectroscopy (AES) the stoichiometric composition of this layer was determined as $Ni_x Yb_y Si_{1-x-y}$ with x=0.55, y=0.12 and 1-x-y=0.33.

All references cited herein, including but not limited to published and unpublished applications, patents, and literature references, are incorporated herein by reference in their entirety and are hereby made a part of this specification. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification are to be understood as being modified in all instances by the term "about." Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention.

The invention claimed is:

1. A method for modulating a work function of a fully silicided gate electrode comprising:
   providing a layer on a gate dielectric, the layer comprising at least one lanthanide, a semiconductor material selected from the group consisting of Si, Ge, and SiGe, and a metal, and
   transforming said layer into a fully silicided gate electrode by siliciding said semiconductor material, wherein an amount of the lanthanide and an amount of the metal present in the layer are selected such that the fully silicided gate electrode thus obtained has a predetermined work function.

2. The method according to claim 1, wherein providing a layer comprises:
   implanting lanthanide ions into a surface of a semiconductor material provided on a gate dielectric, said semiconductor material selected from the group consisting of Si, Ge, and SiGe, and
   depositing a metal layer upon said semiconductor material.

3. The method according to claim 2, wherein said step of implanting lanthanide ions is performed after the transforming step.

4. The method according to claim 2, wherein said step of implanting lanthanide ions is performed between the step of depositing said metal and the transforming step.

5. The method according to claim 2, wherein said gate dielectric is a high-k dielectric layer.

6. The method according to claim 2, wherein said gate dielectric is a high-k dielectric layer wherein k is greater than about 3.9.

7. The method according to claim 2, wherein said lanthanide is Yb.

8. The method according to claim 2, wherein the metal is Ni.

9. The method according to claim 2, wherein siliciding said semiconductor material comprises providing a thermal budget to convert substantially all of said semiconductor material into a silicide, and removing any unreacted metal.

10. The method according to claim 2, wherein the step of transforming said layer into a fully silicided gate electrode comprises:
    providing a first thermal budget to partially convert said semiconductor material into a suicide,
    removing any unreacted metal, and
    providing a second thermal budget for completion of the conversion of said semiconductor material into a suicide.

11. The method according to claim 1, wherein providing the layer comprises depositing a layer comprising at least one lanthanide and a metal capable of silicidation upon or over a surface of a semiconductor material provided on a gate dielectric.

12. The method according to claim 11, wherein depositing said metal and said lanthanide comprises alternately depositing at least one layer of metal and at least one layer of lanthanide.

13. The method according to claim 12, wherein a last layer deposited in said alternating sequence is a metal layer.

14. The method according to claim 12, wherein said metal layer and said lanthanide layer are deposited using sputtering.

15. The method according to claim 11, wherein said metal and said lanthanide are co-deposited.

16. The method according to claim 15, wherein said metal and said lanthanide are simultaneously sputtered.

17. The method according to claim 11 further comprising forming a capping layer over said deposited metal and said deposited lanthanide before the step of transforming said layer into a fully silicided gate electrode.

18. The method according to claim 11, further comprising selectively removing unreacted metal and unreacted lanthanide after forming the fully silicided gate electrode.

19. The method according to claim 11, wherein said gate dielectric is a high-k dielectric layer.

20. The method according to claim 11, wherein said gate dielectric is a high-k dielectric layer wherein K is greater than about 3.9.

21. The method according to claim 11, wherein said at least one lanthanide is Yb.

22. The method according to claim 11, wherein said metal is Ni.

23. The method according to claim 1, wherein the filly silicided gated electrode forms part of a nMOSFET device, and wherein the predetermined work function is smaller than about 4.5 eV.

24. The method according to claim 1, wherein the filly silicided gated electrode forms part of a nMOSFET device, and wherein the predetermined work function is from about 3.9 eV to about 4.5 eV.

25. The method according to claim 1, wherein the fully silicided gated electrode forms part of a nMOSFET device, and wherein the predetermined work function is from about 4 eV to about 4.2 eV.

26. The method according to claim 1, wherein the fully silicided gated electrode is an alloy of formula $Ni_xYb_ySi_{1-x-y}$ wherein $0.3<x<0.7$ and $0.005<y<0.2$.

27. The method according to claim 26, wherein $x=0.55$ and $y=0.12$.

28. The method according to claim 2, wherein the filly silicided gate electrode comprises part of a NiYbSi FUSI gate.

* * * * *

UNITED STATES PATENT AND TRADEMARK OFFICE
CERTIFICATE OF CORRECTION

PATENT NO. : 7,504,329 B2  Page 1 of 2
APPLICATION NO. : 11/382875
DATED : March 17, 2009
INVENTOR(S) : Yu et al.

It is certified that error appears in the above-identified patent and that said Letters Patent is hereby corrected as shown below:

| Issued Patent | | Description of Error |
|---|---|---|
| Column | Line | |
| Title Item (54) Title | 1 | Change "YB-DOPED NI" to --Yb-DOPED Ni--. |
| Title Item (54) Title | 4 | Change "N-MOSFET" to --n-MOSFET--. |
| Title Item (56) Col. 2 | 14 | Under Other Publications, change "Glass" to --Gate--. |
| (Item 56) Page 2 Col. 1 | 3 | Under Other Publications, change "AIO$_3$/GOI" to --AlO$_3$/GOI--. |
| 1 (Title) | 1 | Change "YB-DOPED NI" to --Yb-DOPED Ni--. |
| 1 (Title) | 4 | Change "N-MOSFET" to --n-MOSFET--. |
| 1 | 52 (Approx.) | Change "NMOS" to --nMOS--. |
| 1 | 56 | Change "NMOS" to --nMOS--. |
| 1 | 59 | Change "ev." to --eV.--. |
| 1 | 60 | Change "NMOS" to --nMOS--. |
| 3 | 43 (Approx.) | Change "(Ni)" to --(Ni).--. |
| 8 | 11 | Change "2E15" to --2e15--. |
| 8 | 27 | Change "(2)" to --(2).--. |
| 8 | 48-49 | Change "NMOSFET" to --nMOSFET--. |
| 8 | 52 | Change "FinFet" to --FinFET--. |
| 11 | 28 | Change "circles)," to --circles).--. |
| 12 | 16 | Change "C-v" to --C-V--. |
| 13 | 9 | Change "SION" to --SiON--. |
| 14 | 63 | In Claim 10, change "suicide," to --silicide,--. |
| 14 | 66-67 | In Claim 10, change "suicide." to --silicide.--. |

UNITED STATES PATENT AND TRADEMARK OFFICE
CERTIFICATE OF CORRECTION

PATENT NO. : 7,504,329 B2
APPLICATION NO. : 11/382875
DATED : March 17, 2009
INVENTOR(S) : Yu et al.

It is certified that error appears in the above-identified patent and that said Letters Patent is hereby corrected as shown below:

| | | |
|---|---|---|
| 15 | 14 (Approx.) | In Claim 14, change "arc" to --are--. |
| 16 | 2 | In Claim 20, change "K" to --k--. |
| 16 | 8 | In Claim 23, change "filly" to --fully--. |
| 16 | 12 | In Claim 24, change "filly" to --fully--. |
| 16 | 25 | In Claim 28, change "filly" to --fully--. |

Signed and Sealed this

Eighteenth Day of August, 2009

David J. Kappos
*Director of the United States Patent and Trademark Office*